(12) United States Patent
Iizuka

(10) Patent No.: US 6,851,913 B2
(45) Date of Patent: Feb. 8, 2005

(54) TRANSPORT SYSTEM

(75) Inventor: Yukio Iizuka, Shiga-ken (JP)

(73) Assignee: Daifuki Co., Ltd., Osaka (JP)

( * ) Notice: Subject to any disclaimer, the term of this patent is extended or adjusted under 35 U.S.C. 154(b) by 0 days.

(21) Appl. No.: 10/277,487

(22) Filed: Oct. 22, 2002

(65) Prior Publication Data

US 2003/0077159 A1 Apr. 24, 2003

(30) Foreign Application Priority Data

Oct. 22, 2001 (JP) ........................................ 2001-323429

(51) Int. Cl.[7] .............................................. B65G 47/34
(52) U.S. Cl. ..................................... 414/626; 414/940
(58) Field of Search ................................. 414/626, 940

(56) References Cited

U.S. PATENT DOCUMENTS 6,183,184 B1    2/2001  Shiwaku
6,604,624 B2 *  8/2003  Hirata et al. ................. 414/940

FOREIGN PATENT DOCUMENTS

JP              9077455 A       3/1997

* cited by examiner

*Primary Examiner*—Joseph E. Valenza
(74) *Attorney, Agent, or Firm*—Webb Ziesenheim Logsdon Orkin & Hanson, P.C.

(57) ABSTRACT

A transport system for transporting transport containers storing articles in a sealed condition is disclosed. Each transport container has a support portion formed on an upper portion thereof. When the transport container is moved with the support portion suspended, a receiving device supports the bottom of the transport container to lessen the load applied to the support portion. As a result, deformation of the transport container is restrained to maintained the sealed condition.

14 Claims, 9 Drawing Sheets

TRANSPORT SYSTEM

BACKGROUND OF THE INVENTION

1. Field of the Invention

This invention relates to a transport system having a lift device for raising and lowering articles, and a moving body for moving the lift device.

More particularly, a transport container to be transported includes a main container body defining an opening for storing articles and having a support portion formed on an upper surface of the container body for suspending the container body, and a lid for closing the opening of the main container body. When the opening is closed by the lid, the interior space of the main container body is sealed. The invention relates to a transport system having a lift device for raising and lowering the transport container while suspending the transport container by holding the support portion thereof, and a moving body for moving the lift device.

2. Description of the Related Art

In the transport system having the above construction, articles such as semiconductor substrates that are vulnerable to dust are received in transport containers and transported free from adverse effects of dust. This transport system is used in manufacturing equipment for successively transporting the transport containers to a plurality of processing apparatus that perform various manufacturing processes to manufacture semiconductor substrates or the like. In such manufacturing equipment, the transport containers are placed on receiving surfaces in article loading and unloading stations of the above processing apparatus. When transporting the transport containers, the main container bodies are suspended by the support portions formed on the upper surfaces thereof, raised and lowered, and transported horizontally as necessary.

In such a transport system, conventionally, when transporting the transport containers, each container is suspended by the support portion formed on the upper surface of the main container body continuously from start till end of the transport (see to Japanese Patent Publication (Unexamined) H9-77455).

In the above conventional construction, the transport container may, for example, vibrate up and down during transport. However, since the transport container is supported as gripped and suspended by the support portion formed on the upper surface, the vertical vibration occurring in time of transport causes a dynamic load of articles stored in the main container body. As a result, the transport container is deformed to enlarge the capacity of interior space of the main container body, whereby ambient air could enter the interior space of the main container body through sealed portions between the lid and the main container body. The transport container for storing articles such as semiconductor substrates are often formed of plastic. Such main container body formed of plastic is deformable by the vertical vibration occurring in time of transport, to enlarge the capacity of interior space of the main container body and allow entry of ambient air. Thus, the articles may undergo adverse effects such as lowering of quality.

SUMMARY OF THE INVENTION

This invention has been made having regard to the state of the art noted above, and its object is to provide a transport system for avoiding entry of ambient air to an interior space of a transport container during transport.

According to this invention, the receiving device is switched to the holding position when transporting the transport container. As a result, the receiving device receives the bottom of the transport container suspended from the lift device, and bears the weight of the transport container. This lessens, or reduces to zero, the force of support for the support portion by the lift device. Then, even when the transport container vibrates vertically during transport, for example, little or no deformation of the main container body is allowed, thereby avoiding entry of ambient air to the interior space of the main container body.

Thus, the transport system provided by this invention is effective to avoid ambient air entering the transport container in time of transport.

DESCRIPTION OF THE PREFERRED EMBODIMENT

A transport system according to this invention will be described hereinafter with reference to the drawings.

Figure 1:
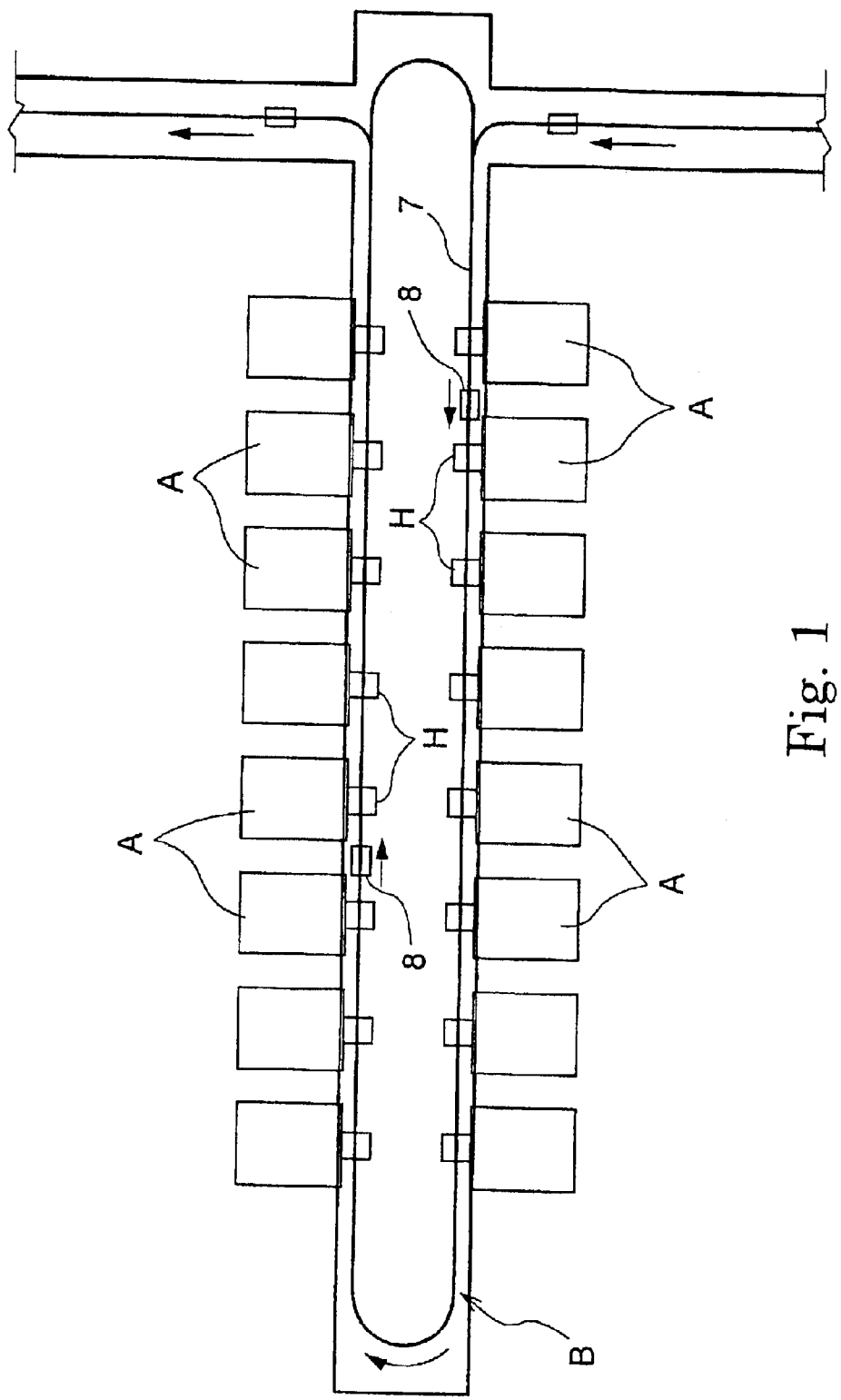
FIG. 1 is a plan view showing an entire transport system.

FIG. 1 shows a portion of manufacturing equipment for manufacturing semiconductor substrates. This equipment is installed in a cleaned indoor space with little dust. The equipment includes a plurality of article processing apparatus A for performing predetermined treatment of half-finished semiconductor substrates in the course of manufacture, and a transport system B for transporting the substrates to container receiving stations H of these article processing apparatus A. The article processing apparatus A are arranged along a direction of article transport (as indicated by an arrow) by the transport system B. As seen from FIG. 1, one row of article processing apparatus A is opposed to a different row of article processing apparatus A. As is well known, and therefore not particularly described herein, these article processing apparatus A successively perform plural types of chemical treatment to manufacture semiconductor substrates.

Figure 2:
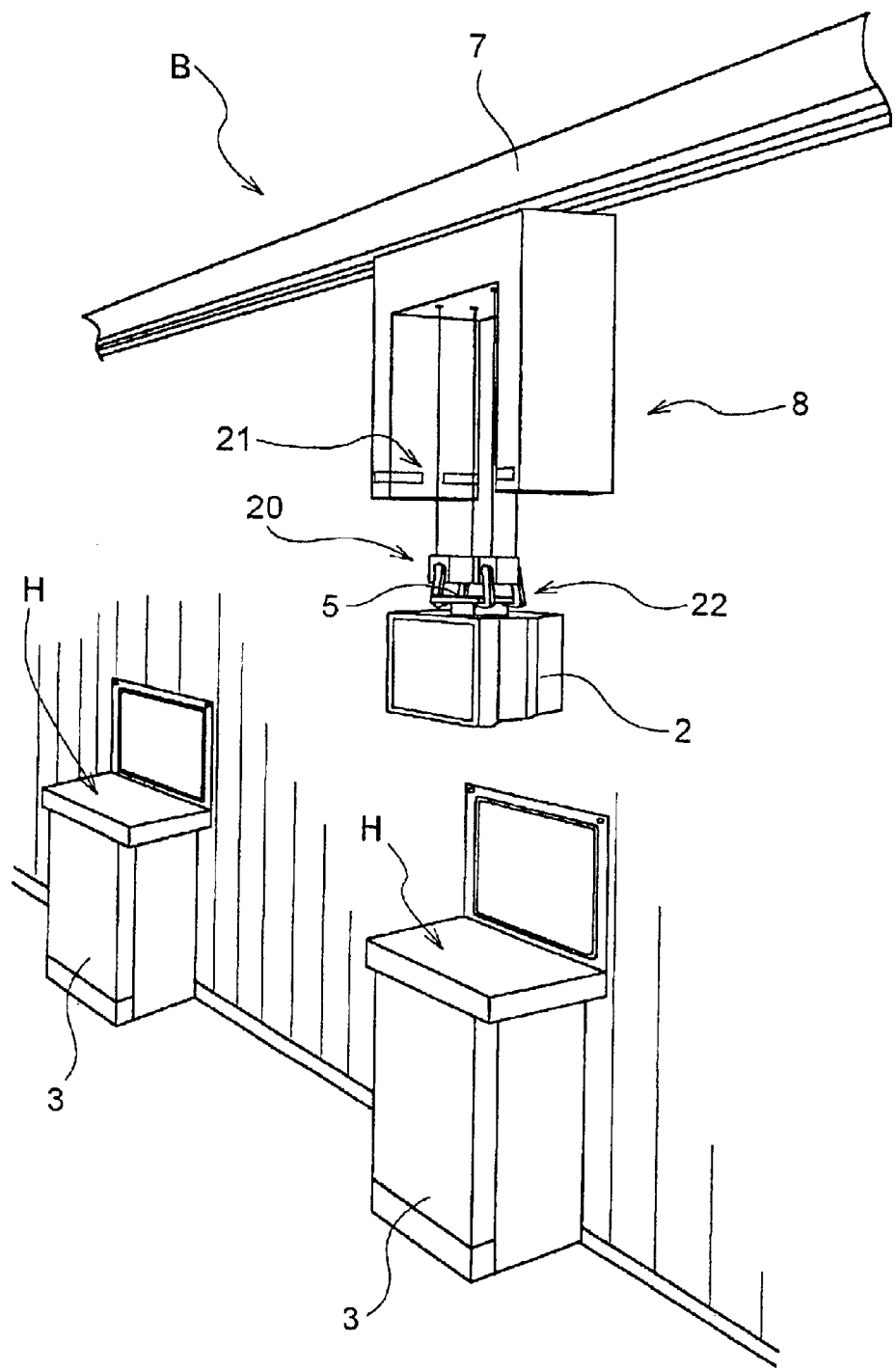
FIG. 2 is a perspective view showing a central portion of the transport system according to this invention.

Next, the construction of transport system B will be described with reference to FIGS. 1 and 2. Semiconductor substrates 1 to be treated are stored in a set number in each transport container 2. The transport container 2 is transported to the container receiving station H of each of the plurality of article processing apparatus A. A container receiving table 3 is disposed at the container receiving station H of each article processing apparatus A. In this transport system, the transport container 2 is placed on the container receiving table 3.

Figure 3:
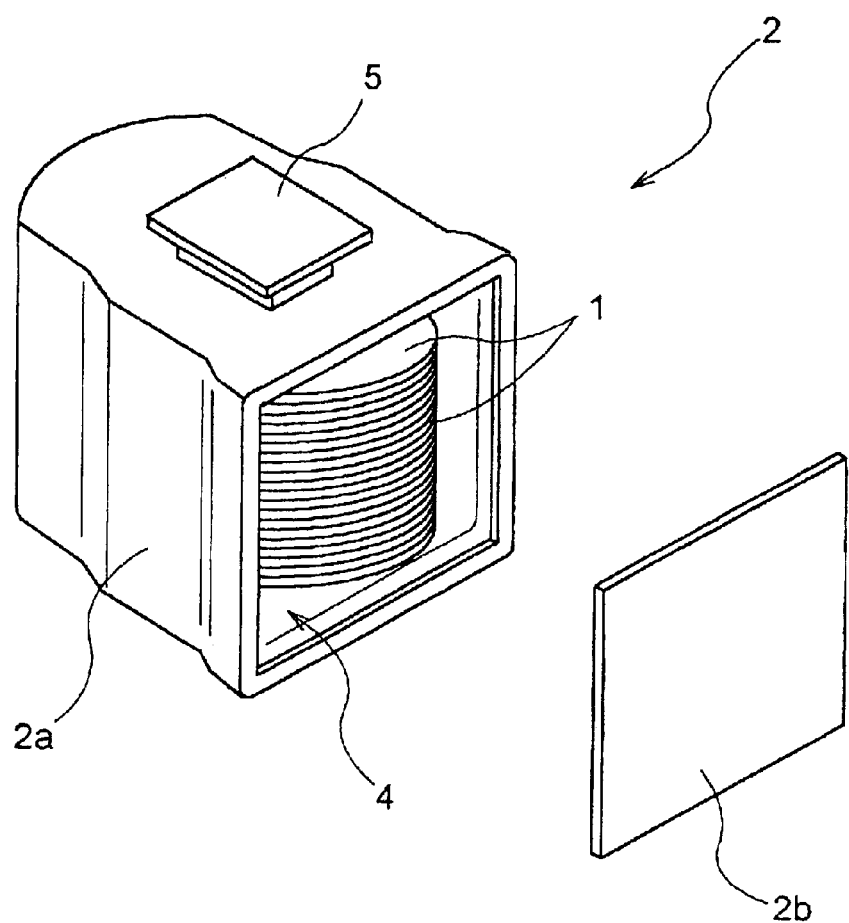
FIG. 3 is a view showing a transport container.

Each transport container 2 is formed of plastic and, as shown in FIG. 3, includes a main container body 2a having an opening 4 formed in one side for receiving semiconductor substrates 1, and a lid 2b for closing the opening 4 in a sealed state. The main container body 2a has, formed on an upper surface thereof, a flange 5 acting as a support portion to be suspended by a gripper described hereinafter. This transport container 2 has an interior space of main container body 2a sealed to admit substantially no entry of dust-laden ambient air through gaps.

Figure 4:
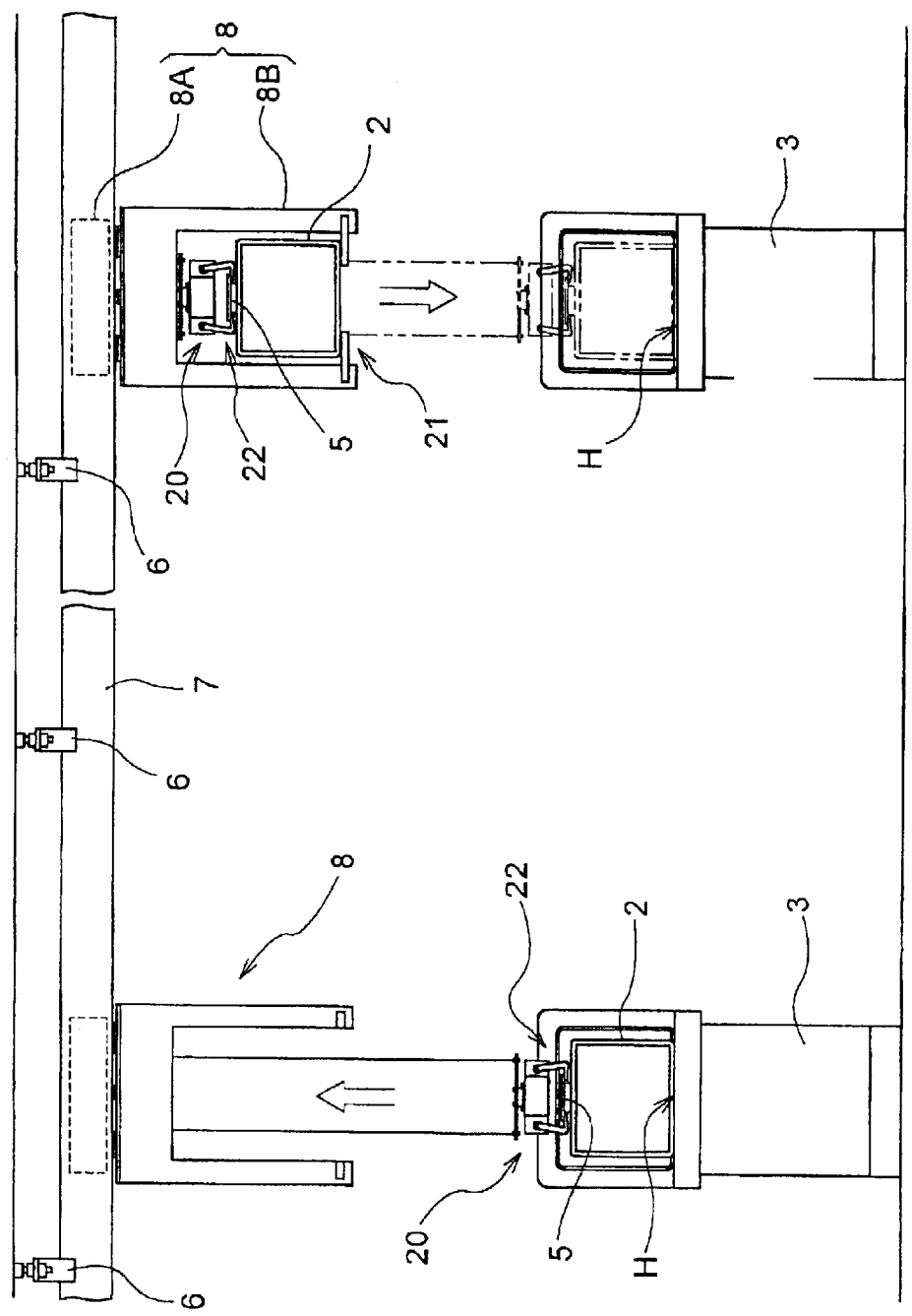
FIG. 4 is a side view showing a state of transport.

Next, a device for transporting such transport containers 2 will be described. As shown in FIG. 4, carrier vehicles 8 run along a guide rail 7 fixed by brackets 6 to a ceiling. Each carrier vehicle 8 includes a vehicle member 8A disposed in an inner space of the guide rail 7 to act as one example of moving body, and a transport action unit 8B connected to the vehicle member 8A and disposed below the guide rail 7. The vehicle member 8A is driven by a linear motor that generates propelling drive, to run along the guide rail 7. The transport action unit 8B is connected by front and rear connecting bars 9 and 10 to the vehicle member 8A. As seen from a section of the guide rail 7 shown in FIG. 7, the guide rail 7 has a pair of right and left legs extending generally vertically and spaced from each other. The inner space is formed between these right and left legs. The legs have guide surfaces 14 formed at lower ends thereof for supporting running wheels 13 of the carrier vehicle 8. In addition, the legs define vibration damping guide surfaces 16 for contacting vibration damping wheels 15.

Figure 7:
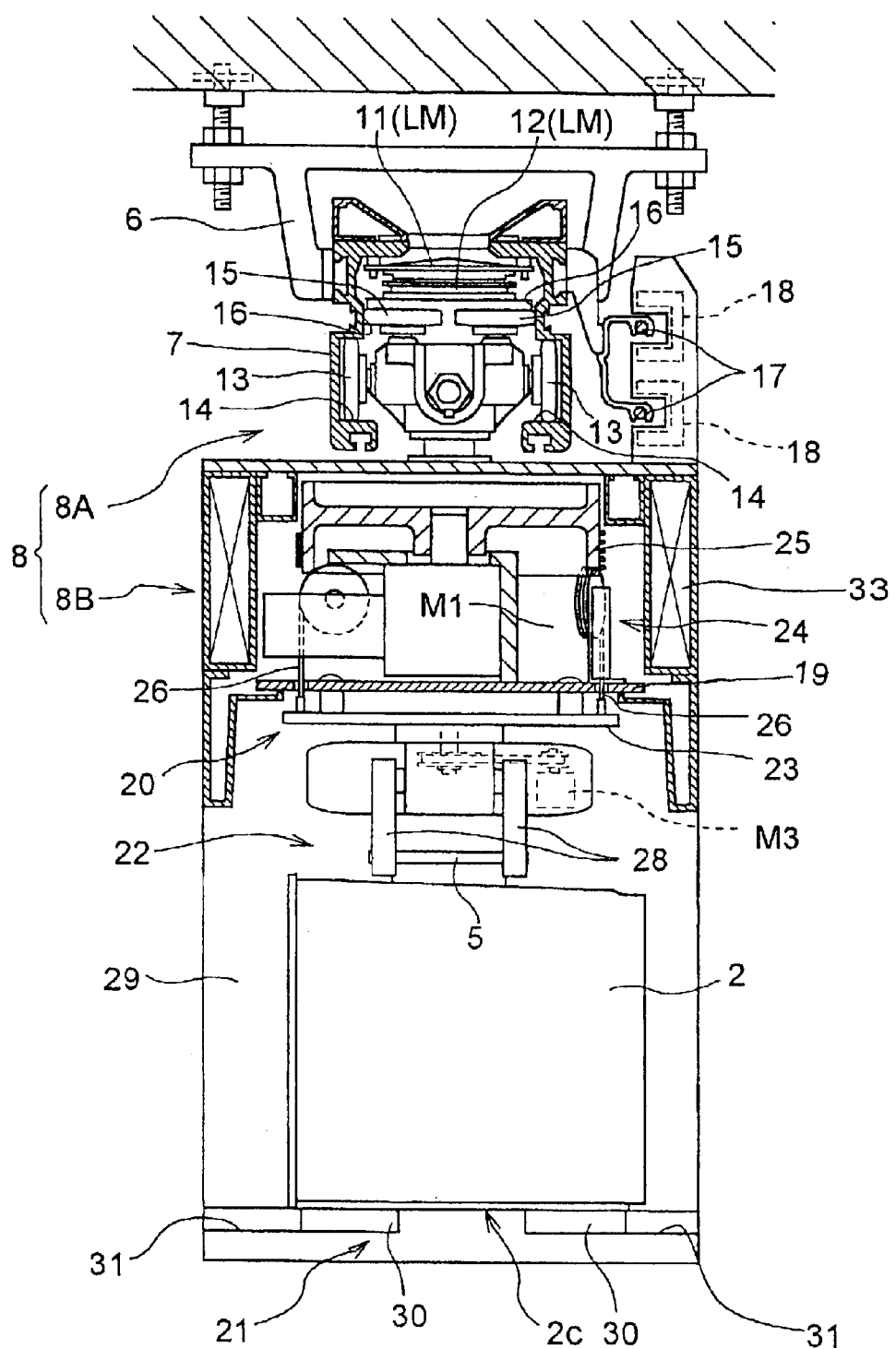
FIG. 7 is a front view in vertical section showing a construction of a carrier vehicle.

The vehicle member 8A derives drive from a linear motor LM for driving the carrier vehicle 8. As shown in FIG. 7, the linear motor LM includes a magnet 11 mounted in the inner space of the guide rail 7, and a primary coil 12 mounted on the carrier vehicle 8 to be adjacent and opposed to the magnet 11. In FIG. 7, numeral 17 denotes power supply lines attached to the guide rail 7, and number 18 denotes power receiver coils attached to the carrier vehicle 8. A supply of AC forms magnetic fields around the power supply lines 17, which in turn generate power on the receiver coils 18 as required by the carrier vehicle 8. In this way, power is supplied in a non-contact mode.

The transport action unit 8B has a frame 19 connected to the vehicle member 8A by the front and rear connecting bars 9 and 10. The frame 19 supports a lift control unit 20 for gripping the flange 5 and raising and lowering the transport container 2 as supported in suspension. Further, the transport action unit 8B includes a holder 21 acting as a receiving device switchable between a holding position for receiving and supporting the bottom 2c of the transport container 2 suspended by the lift control unit 20 and bearing the weight of the transport container 2, and a position retracted from the bottom 2c of the transport container 2.

Figure 6:
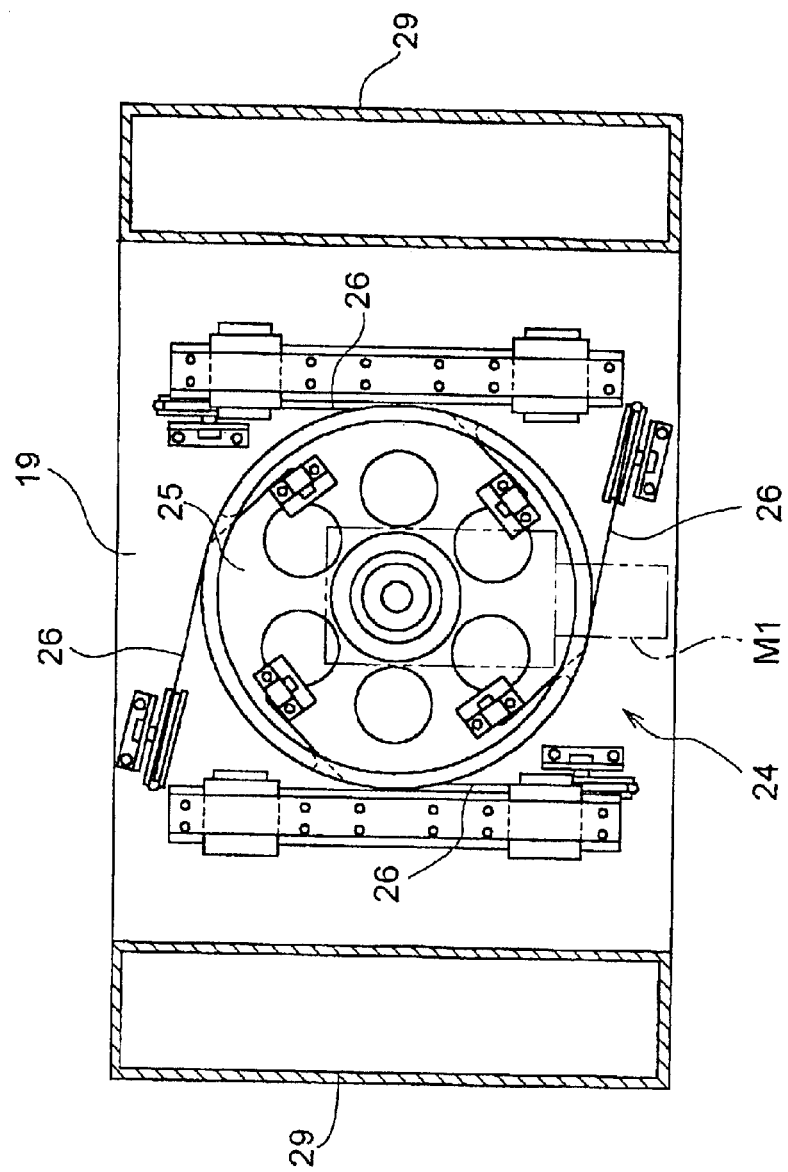
FIG. 6 is a plan view showing a lift mechanism.

More particularly, the lift control unit 20 includes a lift member 23 vertically movable relative to the vehicle member 8A, and a gripper 22 supported by the lift member 23 and switchable between an operative position for gripping the flange 5 of the transport container 2 and a release position for releasing the flange 5. The lift member 23 is vertically movable by a lift control mechanism 24 attached to the frame 19. These lift control unit 20 and lift control mechanism 24 constitute the lift device. As shown in FIGS. 6 and 7, the lift control mechanism 24 has a rotating drum 25 rotatable about a vertical axis by a drum drive motor M1. This rotating drum 25 has a construction to wind and unwind four wires 26 simultaneously. With forward and backward rotations of the rotating drum 25, the lift member 23 supported by the four wires 26 are moved vertically while being maintained in a substantially horizontal posture. The lift control mechanism 24 does not necessarily require such rotating drum 25, but may have a construction for winding and unwinding the respective wires 26 with separate motors.

Figure 5:
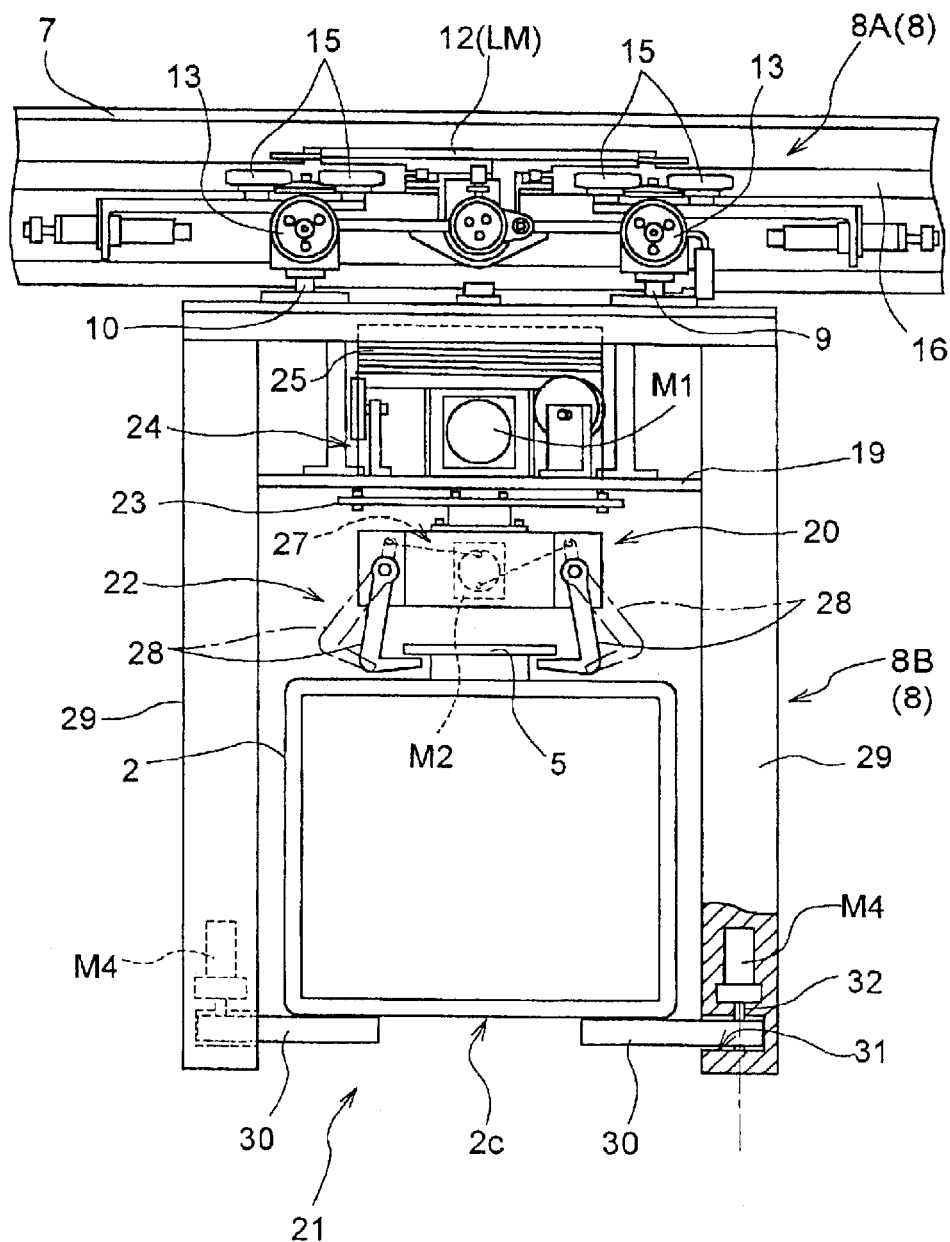
FIG. 5 is a side view showing a construction according to this invention.

As shown in FIGS. 5 and 7, the gripper 22 is switchable between a gripping position for gripping the flange 5 with a gripper actuating motor M2 swinging a pair of gripping members 28 toward each other through a link mechanism 27, and a release position for releasing the flange 5 by swinging the gripping members 28 away from each other. Further, the gripper 22 is attached to the lift member 23 to be rotatable about a vertical axis by a motor M3.

The holder 21 has a pair of vertical frame portions 29 depending from the frame 19 and arranged forward and rearward with respect to the direction of movement of the vehicle member. Each vertical frame portion 29 has a pair of receiving members 30 attached to the lower end thereof. Each receiving member 30 is switchable between a projecting position for receiving and supporting the bottom 2c the transport container 2 raised by the lift control unit 20, and a retracted position out of a lifting path for allowing the lift control unit 20 to raise and lower the transport container 2.

Figure 8:
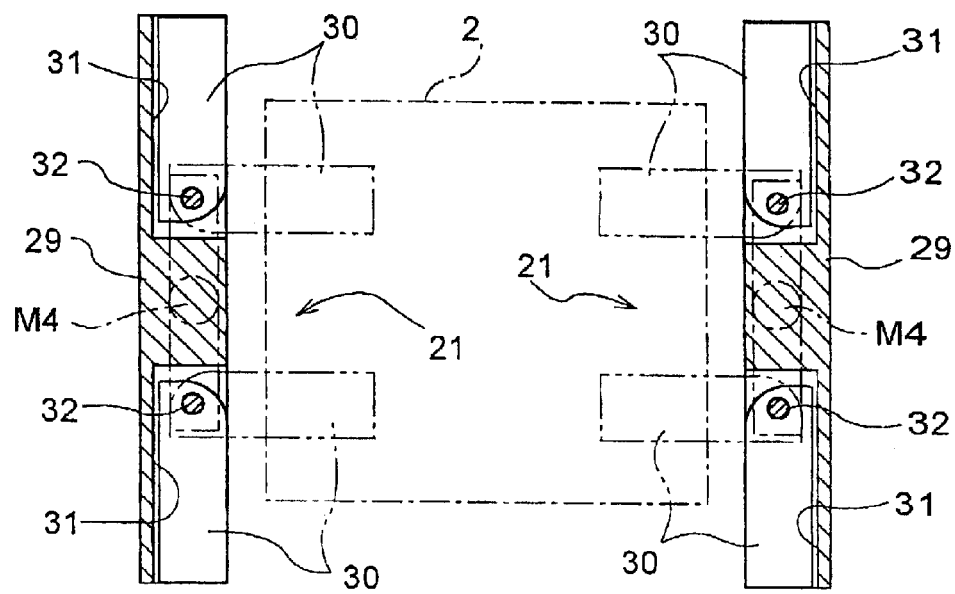
FIG. 8 is a plan view showing a construction of a receiving device.
Figure 9:
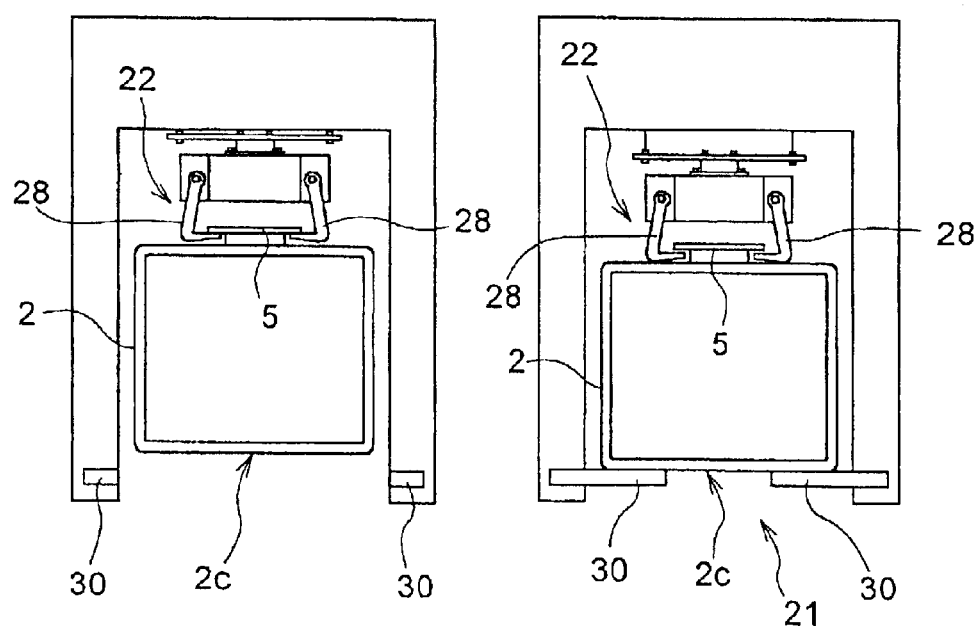
FIGS. 9(A) and 9(B) are front views showing two states of the receiving device.

As shown in FIGS. 8 and 9, each receiving member 30 has one end thereof located in a recess 31 formed in one of the vertical frame portions 29, and is supported by a vertical support shaft 32 to be pivotable about a vertical axis. The support shaft 32 is rotatable by an electric motor M4 with a reduction gear, through a link mechanism not shown, whereby a free end of the receiving member 30 is switched between a position projecting to the lifting path of the transport container 2, and a position retracted into the recess 31. The receiving member 30, with the one end thereof located in the recess 31 formed in the vertical frame portion 29 as noted above, is restrained from vertical displacement by upper and lower inner surfaces of the recess 31. Consequently, the receiving member 30 can receive the transport container 2 even though its load falls on the free end projecting in cantilever fashion.

Numeral 33 in FIG. 7 denotes a controller for controlling movement of the carrier vehicle 8 and operation of the transport action unit 8B in response to instructions from a supervising controller on the ground and to detection information received from sensors or the like, though not particularly described herein, mounted on the carriers 8.

A transporting operation of the transport system having the above construction will be described next. In this operation, each transport container 2 is transported from a transport starting point (i.e. one container receiving station H) to a transport target point (another container receiving station H). Operations of the holder 21 and lift control unit 20 are controlled by the controller 33. As shown in FIG. 4, the carrier vehicle 8 is moved to a position corresponding to the transport starting point, where the lift control unit 20 is lowered. The gripper 22 grips the flange 5 of the transport container 2 placed in the container receiving station H. The transport container 2 is raised to a level close to the carrier vehicle 8. At this time, the lift control unit 20 raises the transport container 2 to an upper limit. As the carrier vehicle 8 begins to move toward the transport target point, the holder 21 is switched from the retracted position to the holding position. Specifically, the receiving members 30 are switched to the projecting positions, respectively. Thereafter, the lift control unit 20 is lowered by a set amount. When the lift control unit 20 is lowered by the set amount, the bottom 2c of the transport container 2 is received and stopped by the receiving members 30. The flange 5 is thereby slightly elevated relative to the gripper 22, thereby reducing the force of support for the flange 5 by the lift control unit 20 to zero. When the receiving members 30 are switched to the projecting positions, respectively, the transport container 2 has been raised to the upper limit with the receiving members 30 lying slightly below the bottom 2c of the transport container 2. Thus, the receiving members 30 may easily be switched to the projecting positions.

The carrier vehicle 8 moves along the guide rail 7 with the weight of the transport container 2 borne by the receiving members 30 as described above. Thus, there is little chance of the transport container 2 being deformed by vibration occurring during the movement of the carrier vehicle 8, to allow entry of ambient air to its interior.

When the carrier vehicle 8 arrives at the position corresponding to the transport target point, the carrier vehicle 8 is stopped, and then the lift control unit 20 is raised to raise the transport container 2 by the set amount with the gripper 22 gripping the flange 5. While the bottom 2c of the transport container 2 is raised above the receiving members 30, the receiving members 30s are switched from the projecting positions to the retracted positions. Subsequently, the lift control unit 20 is lowered with the gripper 22 gripping the flange 5, to place the transport container 2 in the container receiving station H. Then the gripper 22 releases the flange 5 to complete the transporting operation.

Modified Embodiments are Set Out Below (1) In the foregoing embodiment, the operation for switching the holder 21 from the retracted position to the holding position is carried out when the carrier vehicle 8 begins to move toward the transport target point after the transport container 2 is raised close to the carrier vehicle 8. Instead, the switching operation may be carried out as soon as the transport container 2 is raised close to the carrier vehicle 8. In the foregoing embodiment, the operation for switching the holder 21 from the holding position to the retracted position is carried out after the carrier vehicle 8 arrives and stops at the position corresponding to the transport target point. Instead, this switching operation may be carried out a short time before the carrier vehicle 8 stops.

(2) In the foregoing embodiment, when the holder 21 is switched to the holding position, the force of support for the flange 5 by the lift control unit 20 is reduced to zero. Instead, the force of support for the flange 5 by the lift control unit 20 may be reduced to a smaller value than when the lift control unit 20 bears the total weight of the transport container 2.

Figure 10:
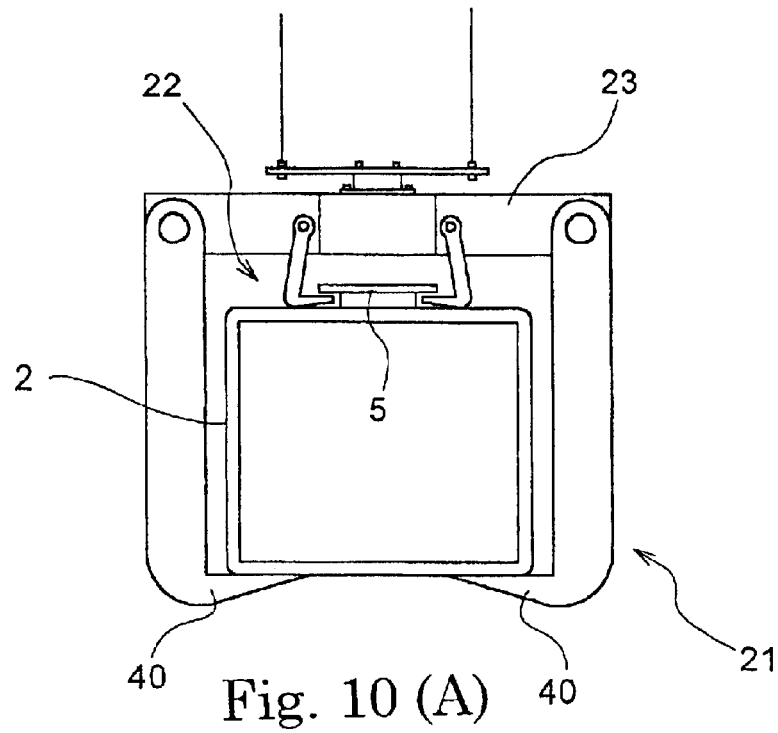
FIGS. 10(A) and 10(B) are side views showing a receiving device in another embodiment.
Figure 10:
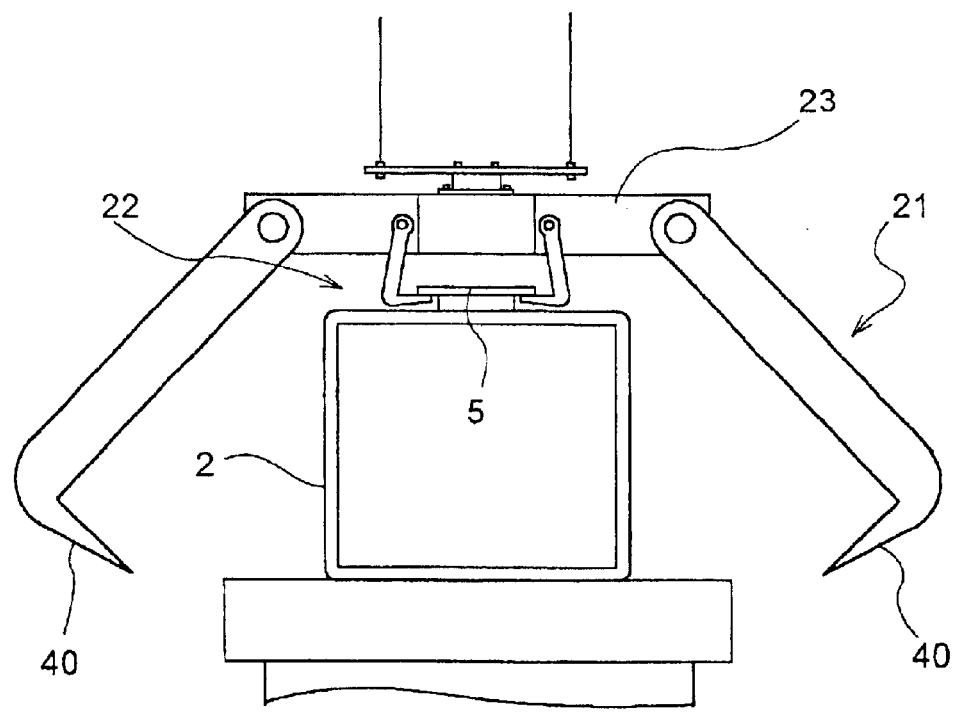

(3) In the foregoing embodiment, the receiving device 21 is mounted on the frame 19 connected to the vehicle member 8A. Instead, the receiving device 21 may be mounted on the lift member 23 of lift control unit 20 in the foregoing embodiment. As shown in FIG. 10, for example, a lift member 23 raised and lowered by a lift control mechanism 24 having the same construction as in the foregoing embodiment may have a pair of receiving members 40 pivotable about horizontal axes by a drive mechanism including an electric motor and a link mechanism. When the receiving members 40 are switched to a holding position immediately after the transport container 2 is gripped and raised slightly, the holding action of the receiving members 40 slightly elevates the transport container 2 to raise the flange 5 slightly above the gripper 22 (see FIG. 10(A)). Then, the vehicle member 8A is moved with the transport container 2 received and raised by the receiving members 40. This construction is effective to avoid entry of unclean ambient air to the container not only during movement of the vehicle member 8A but also when the transport container 2 is raised.

(4) In the foregoing embodiment, the gripper is constructed switchable between the gripping position for gripping the flange by swinging the gripping members, and the release position for releasing the flange by swinging the gripping members away from each other. This construction is not limitative, but may be modified in various ways. For example, the gripping members may be adapted pivotable about vertical axes, or otherwise movable horizontally, to switch between a position for gripping the flange and a position for releasing the flange. The specific construction of the receiving device similarly is not limited to the switching through pivotal movement about the vertical axes as in the foregoing embodiment or to switching through pivotal movement about horizontal axes toward and away from each other, but may be modified in various ways, such as switching by horizontal movement.

(5) In the foregoing embodiment, each moving body is in the form of a vehicle member for running along the guide rail. Instead, it is possible to use linear motor cars which run along the guide rail but have no wheels. Other modifications include use of articulated transport robots.

(6) The foregoing embodiment has been described as having a construction for supplying power to each vehicle member 8A in a non-contact mode. However, this is not limitative, but a contact type power supply may be provided in which a conductor mounted on each vehicle member contacts a power supply rail. Instead of the non-contact type or contact type power supply each vehicle member may carry a storage device such as a battery or capacitor. Each vehicle member may carry a storage device, and yet receive a non-contact type or contact type power supply when appropriate. Then, the storage device may supply power when, for example, no external power supply is available in the contact or no-contact mode.

What is claimed is:

1. A transport system comprising:
   a) a transport container including:
      i) a main container body defining an opening for receiving articles, and an upper support portion for suspension support; and
      ii) a lid for closing said opening of said main container body, wherein an interior space of said main container body is sealed when said lid closes said opening;
   b) a moving body that moves said transport container;
   c) lift means supported by said moving body for suspending said support portion and raising and lowering said transport container;
   d) means for receiving said transport container, switchable between a holding position capable of contacting a bottom of said transport container and of bearing a weight of said transport container and a position retracted from said bottom of said transport container; and
   e) a controller connected for control with said lift means and said receiving means, said controller causing said lift means to be lowered after switching said receiving means to said holding position, whereby at least part of the weight of said transport container is supported by said receiving means, to lessen, or reduce to zero, the force of support for said support portion.

2. The transport system as defined in claim 1, wherein said moving body is a vehicle member movable along a guide rail.

3. The transport system as defined in claim 2, wherein said lift means includes a lift member vertically movable relative to said vehicle member, and a gripper supported by the lift member for gripping said support portion.

4. The transport system as defined in claim 2, wherein said receiving means is fixed to said vehicle member.

5. The transport system as defined in claim 3, wherein said receiving means is fixed to said vehicle member.

6. The transport system as defined in claim 4, wherein said receiving means includes a pair of solid vertical frame portions fixed to said vehicle member, and receiving members disposed adjacent lower ends of said vertical frame portions and having free ends displaceable between projecting positions and retracted positions.

7. The transport system as defined in claim 5, wherein said receiving means includes a pair of solid vertical frame portions fixed to said vehicle member, and receiving members disposed adjacent lower ends of said vertical frame portions and having free ends displaceable between projecting positions and retracted positions.

8. The transport system as defined in claim 6, wherein said receiving members are pivotable about substantially vertical axes.

9. The transport system as defined in claim 7, wherein said receiving members are pivotable about substantially vertical axes.

10. The transport system as defined in claim 1, wherein said receiving means is attached to said lift member.

11. The transport system as defined in claim 1, wherein said transport container is formed of a resin.

12. A transport system comprising:
   a) a transport container including:
      i) a main container body defining an opening for receiving articles, and an upper support portion for suspension support; and
      ii) a lid for closing said opening of said main container body, wherein an interior space of said main container body is sealed when said lid closes said opening;
   b) a vehicle movable along a guide rail;
   c) a gripper movable vertically relative to said vehicle and connectable to said support portion of said transport container; and
   d) receiving members depending from said vehicle and displaceable between a holding position capable of contacting a bottom of said transport container and of bearing a weight of said transport container and a position retracted from said bottom of said transport container, and
   e) a controller connected for control with said gripper and said receiving members, said controller causing said gripper to be lowered after switching said receiving members to said holding position, whereby at least part of the weight of said transport container is supported by said receiving members, to lessen, or reduce to zero, the force of support for said support portion.

13. The transport system as defined in claim 1, wherein said lift means has a first motor for lifting and lowering said transport container and said receiving means has a second motor that can be controlled independently of said first motor and that switches said receiving means between said holding position and retracted position whereby said lifting means is capable of lifting and lowering said transport container without moving said receiving means.

14. The transport system as defined in claim 12, wherein said gripper has a first motor for lifting and lowering said transport container and said receiving members have a second motor that can be controlled independently of said first motor and that switches said receiving members between said holding position and retracted position whereby said gripper is capable of lifting and lowering said transport container without moving said receiving members.

* * * * *

UNITED STATES PATENT AND TRADEMARK OFFICE
CERTIFICATE OF CORRECTION

PATENT NO.   : 6,851,913 B2
DATED        : February 8, 2005
INVENTOR(S)  : Iizuka It is certified that error appears in the above-identified patent and that said Letters Patent is hereby corrected as shown below:

<u>Title page,</u>
Item [73], Assignee, delete "Daifuki Co., Ltd." and insert in its place
-- Daifuku Co., Ltd. --.

Signed and Sealed this

Twenty-third Day of August, 2005

JON W. DUDAS
*Director of the United States Patent and Trademark Office*